United States Patent
White

(10) Patent No.: US 6,169,462 B1
(45) Date of Patent: Jan. 2, 2001

(54) OSCILLATOR WITH CONTROLLED CURRENT SOURCE FOR START STOP CONTROL

(75) Inventor: David Glenn White, Indianapolis, IN (US)

(73) Assignee: Thomson Licensing S.A., Boulogne Cedex (FR)

(*) Notice: Under 35 U.S.C. 154(b), the term of this patent shall be extended for 0 days.

(21) Appl. No.: 09/353,240

(22) Filed: Jul. 14, 1999

(51) Int. Cl.[7] .................................................. H03B 5/32
(52) U.S. Cl. ............................................. 331/158; 331/173
(58) Field of Search .................................... 331/158, 173, 331/116 R, 172, 116 FE

(56) References Cited

U.S. PATENT DOCUMENTS

| | | | |
|---|---|---|---|
| 4,016,508 | * | 4/1977 | Kobori ............................. 331/116 R |
| 4,043,109 | * | 8/1977 | Numabe ................................. 58/23 R |
| 4,370,625 | * | 1/1983 | Someshwar ............................. 331/49 |
| 5,909,152 | * | 6/1999 | Li et al. ......................... 331/116 FE |
| 5,982,246 | * | 11/1999 | Hofhine et al. ................ 331/116 FE |

\* cited by examiner

Primary Examiner—Robert Pascal
Assistant Examiner—Henry Choe
(74) Attorney, Agent, or Firm—Joseph S. Tripoli; Frederick A. Wein; Robert D. Shedd

(57) ABSTRACT

A first inverter is provided with a feedback resistor for biasing the inverter to a linear operating range and an AC feedback path for causing oscillations to occur. A controlled current source, responsive to a control signal Vc supplied thereto and coupled to an input of the inverter supplies a current in a first sense thereto for enabling the oscillations and supplies a current in a second sense thereto for inhibiting the oscillations. The controlled current source comprises a second inverter for amplifying the control signal Vc to a logic level substantially greater than that of the first inverter and a current limiting resistor coupled in series with the second inverter for limiting current flow to and from the input of the first inverter.

5 Claims, 2 Drawing Sheets

US 6,169,462 B1

OSCILLATOR WITH CONTROLLED CURRENT SOURCE FOR START STOP CONTROL

FIELD OF THE INVENTION

This invention relates to oscillators, generally, and to oscillators with start stop control circuitry, in particular.

BACKGROUND OF THE INVENTION

The uses of oscillators are well known. A known form of oscillator comprises an inverting amplifier having a DC feedback path for biasing the amplifier to a linear operating range and an AC feedback path for causing oscillations to occur.

In certain applications, such as in television apparatus, a need may arise for preventing undesired oscillator interference effects. For example, in television receivers, monitors VCR's or the like designed for multi-mode operation (e.g., NTSC and ATSC reception modes), different clock signal frequencies may be required in different operating modes. In general, it is common practice to provide separate oscillators for the respective operating modes rather than changing the frequency of a common oscillator. When separate oscillators are provided, however, signal radiation from an un-used oscillator when receiving signals in one operating mode may be picked up by the video processing circuitry and cause interference effects in displayed images (e.g., "beat" patterns).

Various methods are known for reducing such oscillator interference effects. One method would be to allow the un-used oscillator to continue to run but gate its output. This approach, however, might require shielding the continuously running oscillator which may be both costly and complex. A better approach, which does not require shielding, is to turn off the oscillator that is not being used. This requires an oscillator with start/stop capability.

Two possible methods one might consider for stopping an oscillator are (I) interrupt the oscillator power or (ii) add a load for "swamping" the oscillations (i.e., reducing the loop gain below unity thus not satisfying one of the Barkhausen criteria for oscillations). Such methods, however, are generally unsatisfactory. For example, removing power can create problems with start-up since the oscillator may be required to turn on and off frequently during "channel surfing" and such an approach would also require cut-off circuitry with a very low series drop to keep from reducing the supply voltage (Vcc) of the oscillator down too low. Switching in a load for detuning or loop gain reduction may create new problems necessitating some special circuitry for the oscillator to restore a proper tuning range and loop gain when oscillations are again desired.

SUMMARY OF THE INVENTION

The present invention is directed to meeting the need for an oscillator having start stop capabilities and which overcomes the problems discussed above.

An oscillator, in accordance with the invention, comprises an amplifier having a DC feedback path for biasing the amplifer to a linear operating range and having an AC feedback path for causing oscillations to occur. A controlled current source is coupled to an input of the amplifer, for supplying a current in a first sense thereto for enabling the oscillations and for supplying a current in a second sense thereto for inhibiting the oscillations.

In accordance with a feature of the invention, the controlled current source includes a logic level translator coupled in series with an output current limiting impedance.

BRIEF DESCRIPTION OF THE DRAWING

The foregoing and further features of the invention are illustrated in the accompanying drawing, wherein like elements are denoted by like reference designators, and in which.

DETAILED DESCRIPTION

Figure 1:
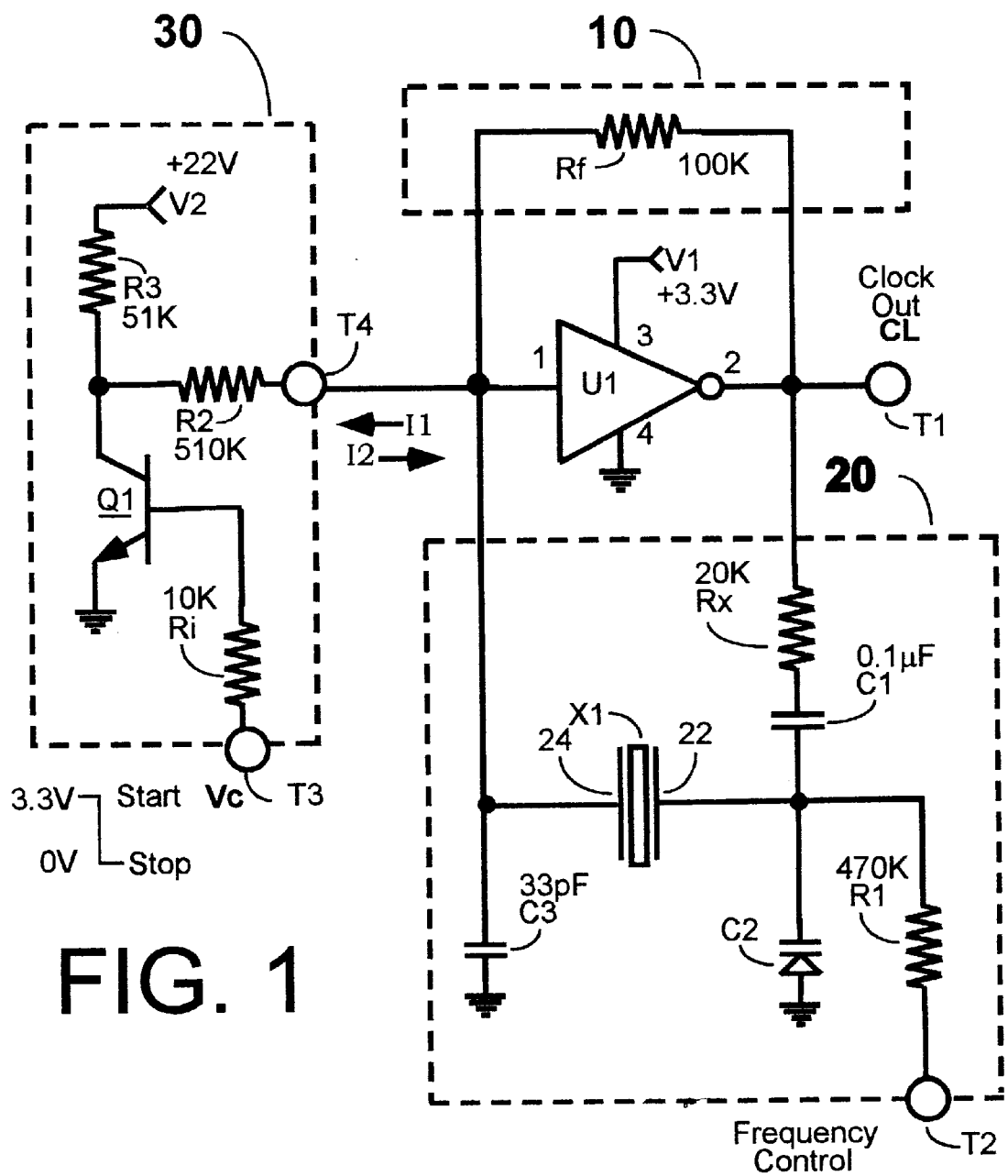
FIG. 1 is a circuit diagram, with exemplary element values, of an oscillator embodying the invention.

The start/stop oscilator of FIG. 1 is a voltage controlled crystal oscillator the principal elenments of which comprise an amplifier having a DC feedback path 10 (outlined in phantom); having an AC feedback path 20 (outlined in phantom); and having a start/stop control circuit 30 (outlined in phantom). Advantageously, these three elements exhibit related characteristics selected to provide low power dissipation in the stopped mode and reliable re-starting when required.

The amplifier U1 is an inverting amplifier (as signified by the circle at its output 2) and includes an input terminal 1, an output terminal 2, a first supply terminal 3 and a second supply terminal 4. Amplifier U1 preferably comprises a high speed (high transconductance) logic gate (e.g., an inverter) such as the type 74AC04 integrated circuit (IC). The first supply terminal 3 is coupled to a source V1 of relatively low positive supply voltage (e.g., +3.3 Volts) and the second supply terminal 4 is coupled to a source of reference potential which, illustratively, is zero Volts (ground). The output 2 of amplifier U1 is also connected to a clock output terminal T1 for supplying a clock output signal CL to subsequent processing circuitry (not shown).

The DC feedback path 10 (outlined in phantom) is provided for biasing the amplifier U1 (inverter) to a linear portion of its operating range. The DC feedback path comprises a feedback resistor Rf. Illustratively, the feedback resistor Rf has a value of 100K Ohms. As explained later, the feedback resistance value is is selected with respect to the output impedance of the control circuit 30 so as to satisfy a particular voltage divider or potentiometric ratio.

The AC feedback path is provided for causing oscillations to occur and, desirably, includes means for varying the oscillation frequency. The feature of variable frequency control makes the crystal oscillator suitable for use, illustratively, in VCXO applications such as in phase locked loops for clock signal recovery in diverse signal processing applications.

The AC feedback path 20 comprises a crystal X1 having a first plate 22 and a second plate 24. The first plate 22 is coupled via a source resistor Rx to the output 2 of amplifier U1. The source resistor Rx which, illustratively, has a value of 20K Ohms. As explained later, this value of the crystal source resistance Rx is very much greater than that used in conventional crystal oscillators (e.g., from 20 to 100 times larger than usual).

In the AC feedback path 20, the first 22 and second 24 plates of crystal X1 are coupled to a source of reference potential (ground, in this case) via a first capacitor C2 of a variable value (e.g., a varactor diode) and a second capacitor C3 of a fixed value, respectively. These elements determine the oscillator frequency which is controlled by applying a DC voltage to a frequency control terminal T1 that is coupled to capacitor C2 (varactor diode) via a relatively high valued resistor R1. To prevent DC from the output of amplifier U1 from interfering with the DC frequency control voltage from terminal T2, a DC blocking capacitor C1 is connected in series with the crystal source impedance Rx. The value of this blocking capacitor (e.g., 0.1 uF) is selected to provide a negligible AC impedance at the operating frequency of the oscillator.

Start stop control of the oscillator of FIG. 1 is provided by the control circuit 30 which comprises a controllable current source responsive to a start/stop control signal Vc at terminal T3. This current source supplies an output current I1 to the input of amplifier U1 when the oscillator is running and supplies an output current I2 of opposite sense when it is desired to stop the oscillator.

Control circuit 30 (outlined in phantom) includes a logic level translator (an amplifier) coupled in series with an output current limiting resistor R2. The logic level translator or amplifier portion of circuit 30 comprises a common emitter connected NPN transistor Q1 having a grounded emitter, having a base connected to a start/stop control input terminal T3 and having a collector coupled via a collector load resistor R3 to a source V2 of relatively high supply voltage (+22 Volts). This voltage (+22 volts) is very much greater than that (+3.3 Volts) supplied to amplifier U1. The collector of transistor Q1 is also coupled to an output terminal T4 via an output current limiting resistor R2 of a very high value as compared with the value of the feedback resistor Rf in the DC feedback path 10. Terminal T4 is directly connected to the input 1 of amplifier (inverter) U1 for withdrawing a current I1 therefrom when oscillations are not desired and for supplying a current I2 thereto when oscillations are desired.

In operation, when oscillations are not desired, the control circuit 30 injects a DC current through a very large resistance (R2) to the input of inverter U1 in order to drive the bias point of the inverter U1 to the logic supply voltage V1 (e.g., 3.3 volts) which kills oscillations completely. The DC turn off current is driven by transistor Q1 which, with input current limiting resistor Ri and collector load resistor R3 forms a logic level translator or amplifier which may be driven by an external logic circuit at relatively low signal levels and provides, at the collector of Q1, a high voltage (e.g., 0–22 volts) output signal. When Vc is low, transistor Q1 is off which drives high voltage (+22V) into the input of inverter U1 via resistors R3 and R2. This results in a voltage divder or potentiometer effect that drives the input of U1 to its supply voltage (+3.3 volts) thus preventing oscillations from occurring.

Figure 2:
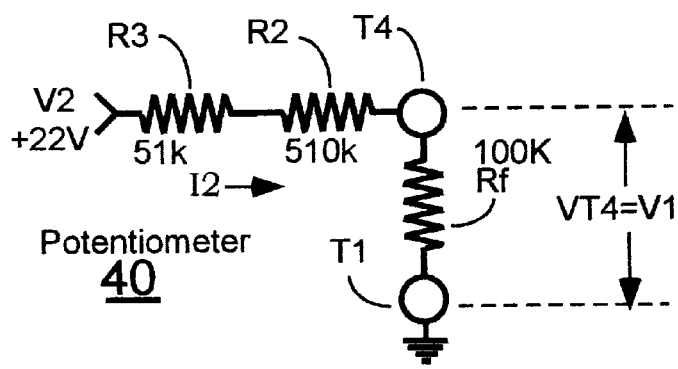
FIG. 2 is a circuit diagram illustrating amplifier biasing during a stop operating mode of the oscillator of FIG. 1.
Figure 3:
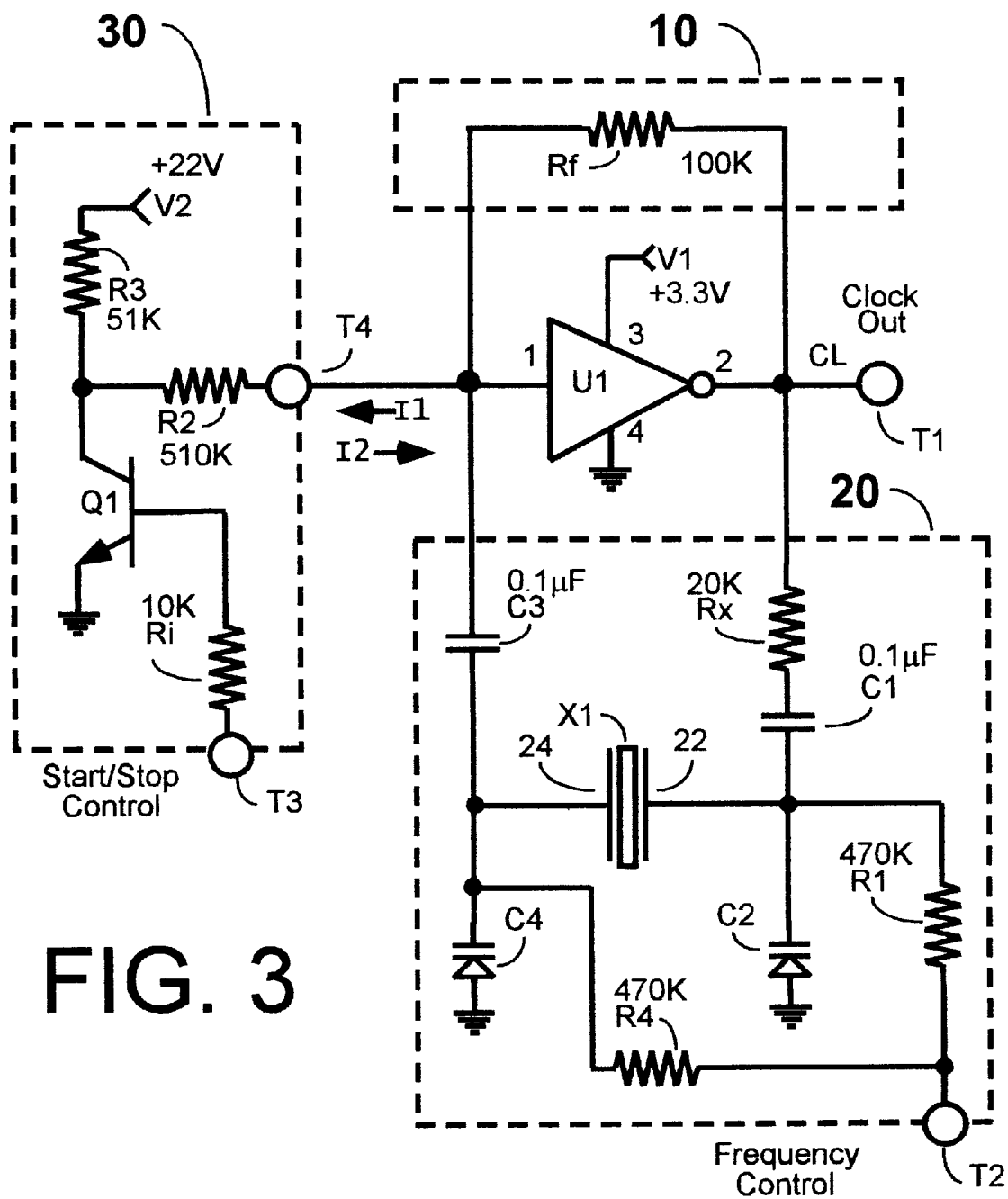
FIG. 3 is a circuit diagram illustrating a modification of the oscillator of FIG. 1.

The potentiometer action for oscillator turn-off is illustrated in FIG. 2 which shows the circuit state when transistor Q1 is turned off. As shown, the turn off current I2 flows through resistors R2 and R3 to the input T4 of inverter U1 and thence to ground via resistor Rf. The reason current flow is to ground is that the output 2 of inverter U1 goes to ground when the input 1 thereof is greater than its threshold voltage (e.g., about half its supply voltage). For the illustrated voltages and resistance values, the output voltage VT4 of control circuit 30 applied to terminal 1 of U1 is very close to the logic supply voltage level (VT4=V1) of inverter U1 and so the clock output signal CL will be at gound level during the stopped operating mode When oscillations are desired, terminal T3 is driven high whereby transistor Q1 is driven into saturation which effectively grounds resistor R2. Since the output current limiting resistor is so large (much greater than Rf) it has been found to have a negligible effect on the phase shift of the "tank" circuit (i.e., AC path 20).

Advantageously, driving the input of inverter U1 through a very high impedance (R2) insures that U1 will not sink too much current at its output (which will be at logic low), insures that the tank will not be loaded when it is grounded, and also prevents VCXO harmonics from radiating into the Vc or +22V terminals when the oscillator is functioning (i.e., operating).

A further benefit is that when Vc changes from low (0 volts) to high (+3.3 volts) and Pin one of U1 slews from V1 back towards its linear bias point (e.g., about half V1), the transient of the bias point sets oscillation into motion which speeds up and improves reliability of start-up. Moreover, the start-up oscillation phase always begins at a consistent value (i.e., starting at zero volts and proceeding in a positive sense).

It will be noted that a relatively high voltage is used in the control circuit 30. It does not have to be as high as +22 volts, but should be higher than the supply voltage V1 of inverter U1 of the oscillator to allow a voltage divider to form that will drive the U1 input 1 to approximately the U1 supply voltage V1 as discussed with regard to FIG. 2. Also, for purposes of optimizing the VCXO in order to ensure that the input I of inverter U1 is not loaded by the control circuit 30, it is desirable that the current limiting resistance R2 be much greater than the feedback resistance Rf. In this example, R2 has a value about five times that of Rf.

In the example of FIG. 1, the AC feedback path 20 is of a novel design wherein the source resistance Rx for the crystal X1 is many times higher than that of a conventional VCXO and the load capacitance C3 is of a fixed rather than a variable type.

Advantageously, the above features of the AC feedback path 20 have been found to provide a superior oscillator with an extended deviation (tuning range) and with reduced pulse width modulation effects as compared with conventional AC feedback paths for VCXO's.

In certain applications, these desireable characteristics may not needed. For example, in cases where a relatively narrow band tuning range is all that is needed and pulse width modulation effects may be tolerated, one may modify the AC feedback path 20 of FIG. 1 to use a conventional VCXO AC feed back path as shown in FIG. 2. There, the AC feedback path 20 is modified by replacing the fixed capacitor C3 with a variable capacitor C4 comprising a varactor diode. Control voltage for the varactor diode is provided by means of a resistor R4 coupled from the diode to the frequency control terminal T2 via a resistor R4. Except for these changes, operation is otherwise the same as in the example of FIG. 1 except, of course, for the reduced tuning range and a tendency for pulse width modulation effects to occur for rapidly changing values of the control signal Vc.

It will be appreciated that various changes or modifications may be made to the illustrative examples of the invention herein described. For example, the controlled current source may include other forms of logic level translators provided the voltage and output impedances satisfy the conditions previously to described. Also, where fixed (rather than variable) frequencies are desired, the AC feedback path may dispense with variable capacitors and use fixed capacitors instead. Also, if crystal control is not required in a given application, the AC feedback circuit may be modified to include an inductor/capacitor filter rather than a crystal for feedback purposes.

What is claimed is:

1. An oscillator comprising:

an amplifier;

a DC feedback path for biasing the amplifier to a linear operating range;

an AC feedback path for causing oscillations to occur;

a controlled current source, coupled to an input of said amplifier, for supplying a current in a first sense thereto for enabling the oscillations and for supplying a current in a second sense thereto for inhibiting the oscillations; and wherein said controlled current source comprises a logic level translator coupled in series with an output current limiting impedance.

2. An oscillator as recited in claim 1 wherein:

said logic level translator has an input for receiving a start/stop control signal Vc having a given voltage range and an output providing a translated output voltage having a substantially greater voltage range; and said output current limiting impedance comprises a resistor having a value substantially greater than the impedance of said DC feedback path.

3. An oscillator, comprising:

a first inverter having a feedback resistor for biasing the inverter to a linear operating range and having an AC feedback path for causing oscillations to occur; and a controlled current source, responsive to a control signal Vc supplied thereto and coupled to an input of said inverter for supplying a current in a first sense thereto for enabling the oscillations and for supplying a current in a second sense thereto for inhibiting the oscillations; and wherein said controlled current source comprises a second inverter for amplifying said control signal Vc to a logic level substantially greater than that of said first inverter and a current limiting resistor coupled in series with said second inverter.

4. An oscillator, comprising:

first and second sources of supply voltage, the voltage of the second source being substantially greater than that of the first source;

an inverter having an input terminal, an output terminal and a supply terminal, said supply terminal being coupled to receive said first source of supply voltage;

a first resistor and an AC feedback path coupled between said input and output terminals of said inverter; and switch means, responsive when closed for coupling said input terminal of said inverter to a point of reference potential via a second resistor and responsive when open for coupling said input terminal of said inverter to said second source of supply voltage V2 via said second resistor and a third resistor, said second resistor having a value substantially greater than that of said first resistor; and means for opening and closing said switch means.

5. A method for providing controlled oscillations, comprising the steps of:

providing first and second sources of supply voltage;

providing an inverter having an input terminal, an output terminal and a supply terminal;

coupling said supply terminal of said inverter to receive said first source of supply voltage;

coupling a first resistor and an AC feedback path between said input and output terminals of said inverter;

coupling said input terminal of said inverter to a point of reference potential via a second resistor when oscillations are desired;

coupling said input terminal of said inverter to said second source of supply voltage via said second resistor and a third resistor when oscillations are not desired;

selecting said second resistor to have a resistance value substantially greater than that of said first resistor; and selecting the voltage of the second source to be substantially greater than that of the first source.

* * * * *